(12) United States Patent
Dowlatabadi

(10) Patent No.: US 8,264,266 B2
(45) Date of Patent: Sep. 11, 2012

(54) CLOCK WITH REGULATED DUTY CYCLE AND FREQUENCY

(75) Inventor: Ahmad B. Dowlatabadi, San Jose, CA (US)

(73) Assignee: Aivaka, Inc., San Jose, CA (US)

( * ) Notice: Subject to any disclaimer, the term of this patent is extended or adjusted under 35 U.S.C. 154(b) by 0 days.

(21) Appl. No.: 11/796,308

(22) Filed: Apr. 26, 2007

(65) Prior Publication Data

US 2007/0262826 A1 Nov. 15, 2007

Related U.S. Application Data (60) Provisional application No. 60/796,021, filed on Apr. 26, 2006.

(51) Int. Cl.
*G06F 1/04* (2006.01)
(52) U.S. Cl. ............... 327/291; 327/63; 327/293
(58) Field of Classification Search .......... 327/291, 327/293, 63
See application file for complete search history.

(56) References Cited

U.S. PATENT DOCUMENTS

| | | | |
|---|---|---|---|
| 3,477,002 A | 11/1969 | Campbell | |
| 3,594,649 A * | 7/1971 | Rauch | 327/101 |
| 3,936,715 A | 2/1976 | Nixon et al. | |
| 4,337,529 A | 6/1982 | Morokawa | |
| 4,743,783 A | 5/1988 | Isbell et al. | |
| 5,485,077 A | 1/1996 | Werrbach | |
| 5,912,575 A | 6/1999 | Takikawa | |
| 5,978,318 A | 11/1999 | Kawaguchi et al. | |
| 6,069,807 A | 5/2000 | Boylan et al. | |
| 6,184,663 B1 | 2/2001 | Imai et al. | |
| 6,404,290 B1 | 6/2002 | Voo | |
| 6,473,457 B1 | 10/2002 | Pacual et al. | |
| 6,624,619 B2 | 9/2003 | Fujita et al. | |
| 6,670,796 B2 | 12/2003 | Mori | |
| 6,674,272 B2 | 1/2004 | Hwang | |
| 6,815,938 B2 | 11/2004 | Horimoto | |
| 6,847,231 B2 * | 1/2005 | Kinugawa et al. | 326/82 |
| 6,906,499 B2 | 6/2005 | Hussein et al. | |
| 7,091,770 B2 | 8/2006 | Schlaffer | |
| 7,102,338 B2 | 9/2006 | Osburn et al. | |
| 7,208,919 B2 | 4/2007 | May | |
| 7,265,523 B2 | 9/2007 | Dowlatabadi | |
| 7,336,060 B2 | 2/2008 | Ito | |
| 7,420,357 B2 | 9/2008 | Bayer | |
| 7,652,603 B2 | 1/2010 | Morishima | |
| 2005/0134393 A1 | 6/2005 | Kim et al. | |
| 2006/0082394 A1 * | 4/2006 | Briskin et al. | 327/77 |
| 2006/0119400 A1 * | 6/2006 | Ohnhauser et al. | 327/74 |
| 2008/0265880 A1 * | 10/2008 | Nishikawa | 324/251 |

FOREIGN PATENT DOCUMENTS

EP 0735677 2/1996

* cited by examiner

*Primary Examiner* — John Poos
(74) *Attorney, Agent, or Firm* — James E. Eakin (57) ABSTRACT

A power-supply-independent clock, with controlled $T_{High}$ and $T_{Low}$ that permits both frequency and duty cycle to be set simultaneously and independently. Depending upon the implementation, the control values can be varied for frequency and duty cycle as determined by the user, or can be dependent upon temperature, power supply variations, or any other variable within the system, design or device that includes the clock.

12 Claims, 9 Drawing Sheets

Figure 8 Different values for $V_{High}$ (vertical axis) as a function of $V_{DD}$ (horizontal axis) both in Volts calculated from equation 14 for $V_{REF}=0.35$ and $R1=25(R2)$.

Figure 9

CLOCK WITH REGULATED DUTY CYCLE AND FREQUENCY

RELATED APPLICATION

This application claims the benefit of U.S. Provisional Patent Application Ser. No. 60/796,021 filed Apr. 26, 2006, which is incorporated herein by reference in its entirety.

FIELD OF THE INVENTION

This invention relates generally to creating clock signals for electronic equipment, and more particularly relates to creating clock signals where both the duty cycle and the frequency can be varied simultaneously.

BACKGROUND OF THE INVENTION

Clocks are commonly used in various electronic systems and circuits to provide timing references. They are used in numerous integrated circuits (IC's) such as microprocessors and data converters, and typically are required in any communication or telecommunication systems. Many different methods exist for generating a clock signal. Oscillators in one form or another are typically used, and may for example include a Schmitt trigger and an RC network, or op amps or comparators with positive feedback, or a crystal which oscillates when a voltage is applied, with or without a phase-locked loop (or PLL). Likewise, a free-running ring oscillator might be used, typically constructed of an odd number of inverters or similar single gain stages. Each approach has its own advantages and drawbacks. Ring oscillators and Schmitt trigger oscillators are smaller and easier to implement than crystal (or PLL) circuits. However, crystal (and PLL) based clocks have highest accuracy of the oscillation frequency. So, the accuracy of clock is often improved at the expense of increased designs complexity, cost and power consumption.

Figure 1:
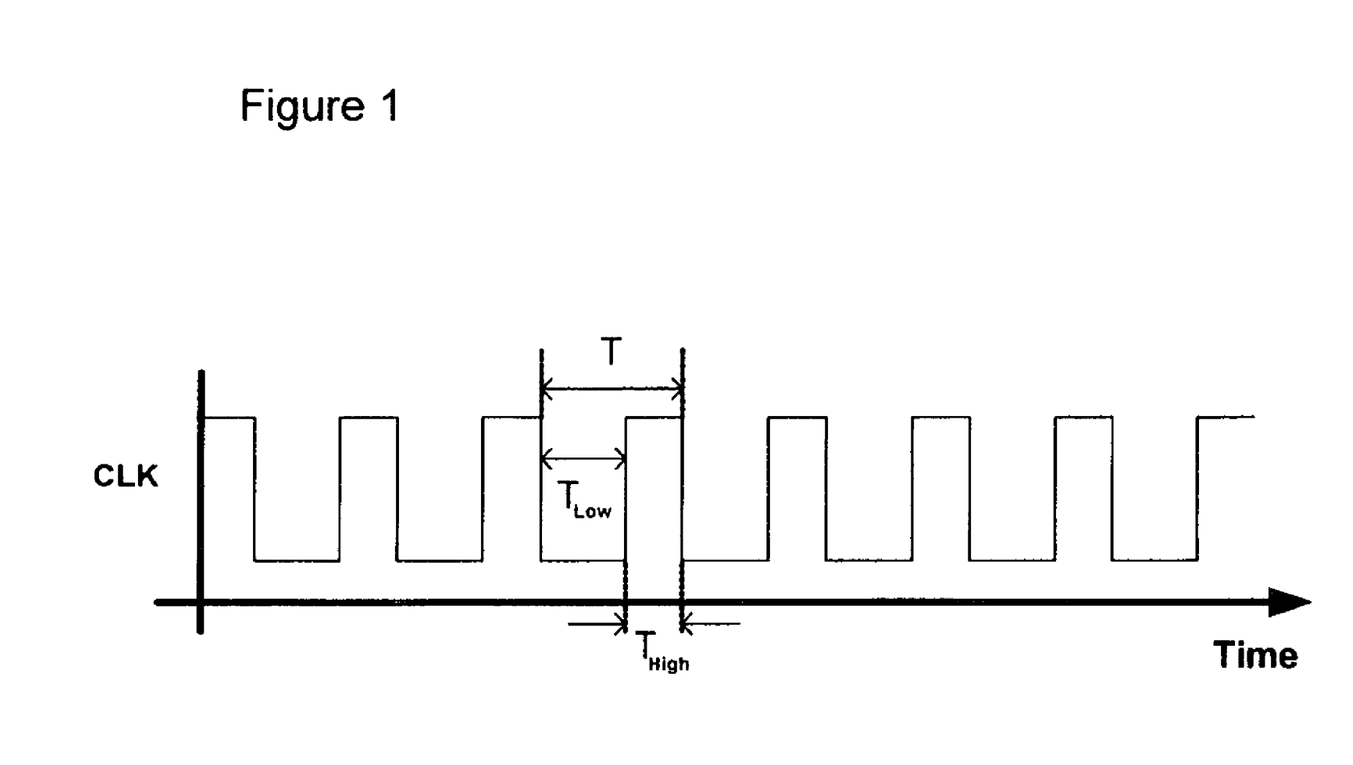
FIG. 1 illustrates determination of clock cycle.

Regardless of the design for a clock, duty cycle and frequency are two important elements. Referring to FIG. 1, duty cycle of a clock is defined as $$D = T_{High}/T = T_{High}/(T_{High} + T_{Low}) \quad (1)$$

where T is the total period of the clock and its related to its frequency f by T=1/f, $T_{High}$ is the duration of clock within a period T for which the clock is at logic 1, and $T_{Low}$ is the duration of clock within a period T for which the clock is at logic 0. Typically, frequency of a clock can be controlled independent of its duty cycle and its duty cycle can be regulated separate from its frequency by various methods. However, the prior art has not permitted simultaneous variation of both frequency and duty cycle, which permits, among other things, adjustment for operating conditions.

SUMMARY OF THE INVENTION

The present invention provides a power supply independent clock with controlled reference values to permits both frequency and duty cycle to be set simultaneously. In an embodiment, $T_{High}$ and $T_{Low}$ are controlled through the use of two voltage detectors, where reference voltages $V_{High}$ and $V_{Low}$ are supplied to a control block to adjust frequency and duty cycle.

In an alternative embodiment, only a single voltage detector is used, and $V_{High}$ and $V_{Low}$ are appropriately switched to cause the adjustment of frequency and duty cycle.

DETAILED DESCRIPTION OF THE INVENTION

Figure 2:
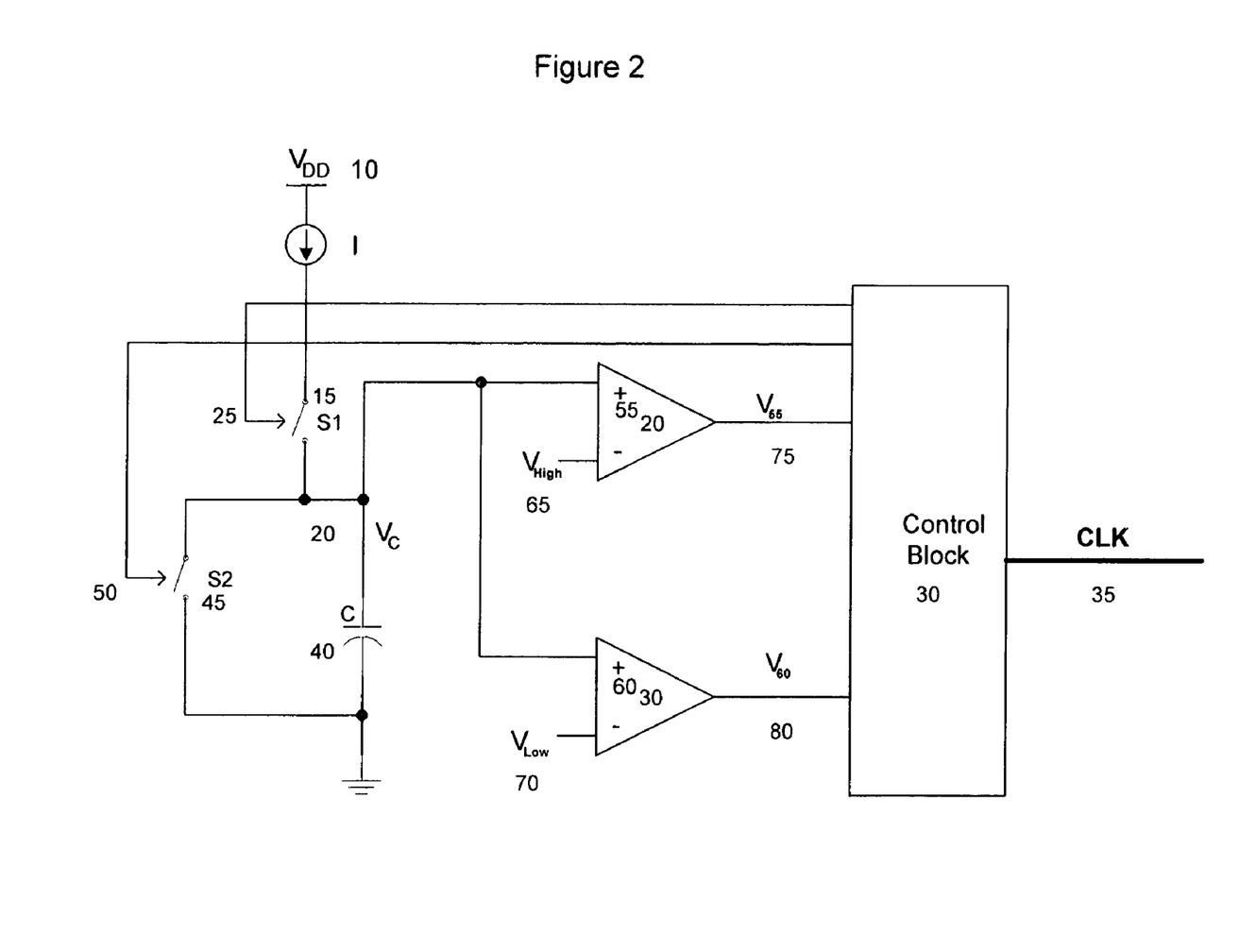
FIG. 2 illustrates a clock circuit in accordance with the present invention.
Figure 3:
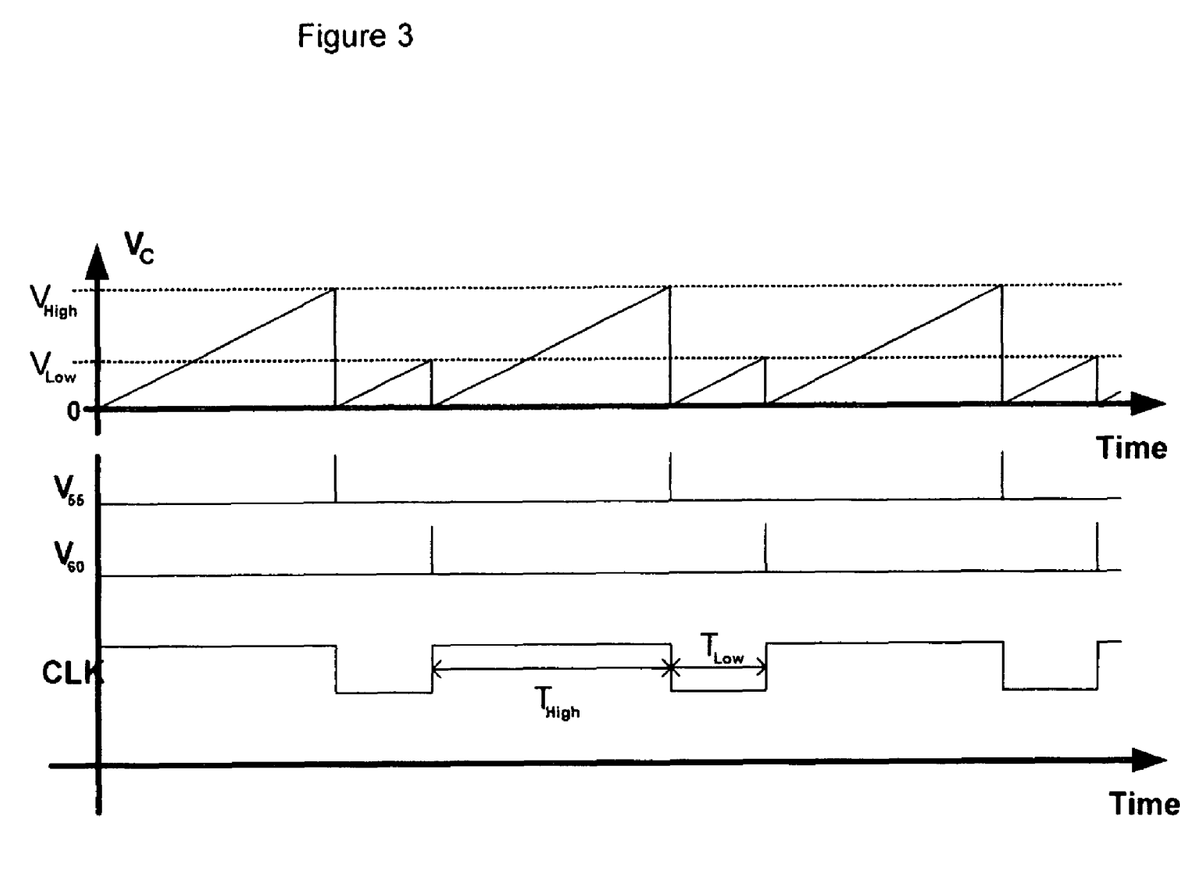
FIG. 3 is a timing diagram for the circuit of FIG. 2.

The present invention provides a power supply independent clock with controlled $T_{High}$ and $TL_{Low}$, which permits both frequency and duty cycle to be set simultaneously. Reference is made to FIGS. 2 and 3, which show, respectively, a block diagram of a clock generator block in accordance with the invention a timing diagram of the key signals in the design. Here, two voltages $V_{Low}$ and $V_{High}$ are used to set the duty cycle of a clock signal CLK according to $$T_{Low} = \alpha V_{Low} \quad (2)$$

$$T_{High} = \beta V_{High} \quad (3)$$

Parameters α and β are two constant coefficients with units of second/volt (s/v). The period of CLK is defined by $$T = T_{Low} + T_{High} = \alpha V_{Low} + \beta V_{High} \quad (4)$$

and its frequency is obtained from $$f = 1/T = 1/(\alpha V_{Low} + \beta V_{High}) \quad (5)$$

So the duty cycle of CLK is $$D = T_{High}/T = \beta V_{High}/(\alpha V_{Low} + \beta V_{High}) \quad (6)$$

Values of $V_{High}$, $V_{LOW}$, β, and β can be set by various methods within a system (using digital or analog circuitries). Those skilled in the art will recognize that this permits both duty cycle and frequency to be varied simultaneously in the present invention, as discussed in greater detail hereinafter.

Voltages $V_{High}$ and $V_{Low}$ and coefficients α and β can be set to have constant values, which would result in a fixed clock frequency with a fixed duty cycle. Or, voltages $V_{High}$ and $V_{Low}$, and coefficients α and β can all have adjustable (and, in at least some embodiments, can be user defined) values that can be dependent upon, for example, temperature, power supply variations, or any other variable within the system, design or device that includes the clock.

Figure 9:
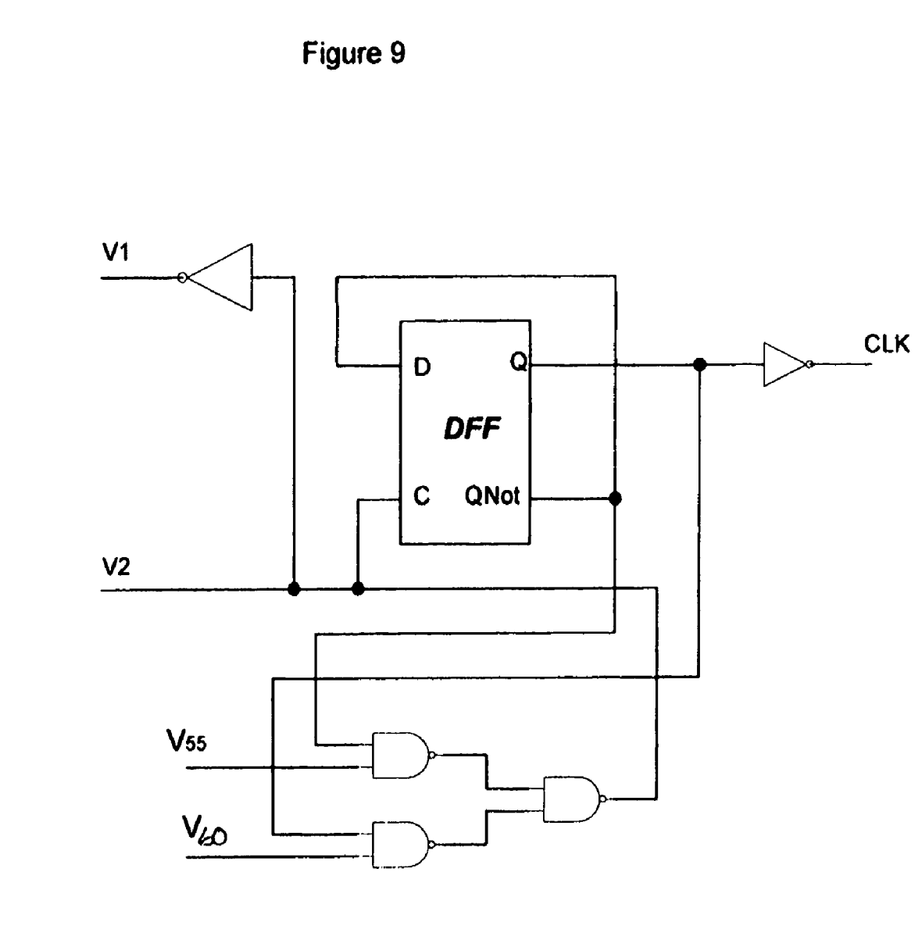
FIG. 9 illustrates one of many possible implementions of control block 30.

Referring again to FIG. 2, the operation of the present invention may be better understood. A voltage $V_{DD}$, indicated at 10, supplies a current I to a switch S1, indicated at 15. The switch S1 closes and connects $V_{DD}$ to a node $V_c$, indicated at 20, in response to a control signal 25 which is supplied from Control Block 30 at times discussed hereinafter. Control Block 30 can be implemented in a variety of ways; one example is shown in FIG. 9. The Control Block 30 also supplies as its output a clocking signal CLK indicated at 35. Connected between the node $V_c$ and ground is a capacitor C, indicated at 40. It will therefore be appreciated that the node $V_c$ represents the voltage across the capacitor C. A second switch, S2 indicated at 45, is connected across the capacitor C, and switch S2 closes in response to a second control signal, indicated at 50, from the Control Block 30 at times discussed hereinafter.

The node $V_C$ supplies a positive input to a pair of detectors, indicated at 55 and 60, which may be any of a variety of devices suited to detecting a voltage change, including a voltage comparator, Schmitt trigger, an operational amplifier operating either open loop or with high gain through small feedback. The negative input to the detector 55 is supplied by a voltage $V_{high}$, while the negative input to the detector 60 is provided by a voltage $V_{low}$. The outputs of the detectors, $V_{55}$ and $V_{60}$, are supplied to the Control Block 30 and form the output clock signal.

With the foregoing circuit in mind, the operation of the clock of the present invention can be explained. To begin, assume an initial condition where the voltage on the capacitor C is at zero volts ($V_C$=0). Then, when switch S1 closes, current I flows into the capacitor C and the voltage on capacitor C starts increasing toward $V_{DD}$. At this point the detector 60 is disabled and only detector 55 is operational. So, once $V_C$ reaches $V_{High}$ ($V_C = V_{High}$), the output of the detector 55 changes state from zero to high (from logic 0 to 1). At that point switch S1 opens and switch S2 closes to discharge the capacitor C to ground (now $V_C$=0 again). The value of $T_{High}$ is obtained from $$T_{High}=(V_{High}C)/I \quad (7)$$

After C is discharged to ground, switch S1 closes again and capacitor C starts charging toward $V_{DD}$. But now detector 55 is disabled and detector 60 is enabled because of the voltages $V_{high}$ and $V_{low}$ relative to $V_c$. Once $V_C$ reaches $V_{Low}$ ($V_C = V_{Low}$), the output of detector 60 changes state from 0 to 1, which in turn opens S1 and closes S2. Now $T_{Low}$ is calculated from $$T_{Low}=(V_{Low}C)/I \quad (8)$$

Those skilled in the art will therefore appreciate that the two coefficients $\alpha$ and $\beta$ (in equations 2-6) are $$\alpha=\beta=C/I \quad (8)$$

Thus, the frequency of the clock signal 35 is calculated from $$f=1/T=I/[C(V_{High}+V_{Low})] \quad (9)$$

The duty cycle of the clock signal 35 is obtained from $$D=T_{High}/(T_{Low}+T_{High})=V_{High}/(V_{High}+V_{Low}) \quad (10)$$

So for a 50% duty cycle, $V_{High}=V_{Low}$, yet for a 25% duty cycle, $V_{Low}=3V_{High}$.

It will be appreciated that the clock frequency, f, is a constant value for a fixed current I, fixed value for capacitor C, and constant $V_{High}$ and $V_{Low}$. On the other hand, by fixing voltages $V_{High}$ and $V_{Low}$, the duty cycle and frequency of the clock can easily be manipulated by changing values of I or C in a design.

In addition, if current I and capacitor C are temperature and power supply independent, then frequency and duty cycle of CLK becomes independent of any temperature and power supply modulations (for fixed values for $V_{High}$ and $V_{Low}$). As noted previously, detectors 55 and 60 can be a voltage comparator, Schmitt trigger, an operational amplifier (that is operating in open loop or with little feedback to have a large gain) or any device capable of detecting voltage changes.

Figure 4A:
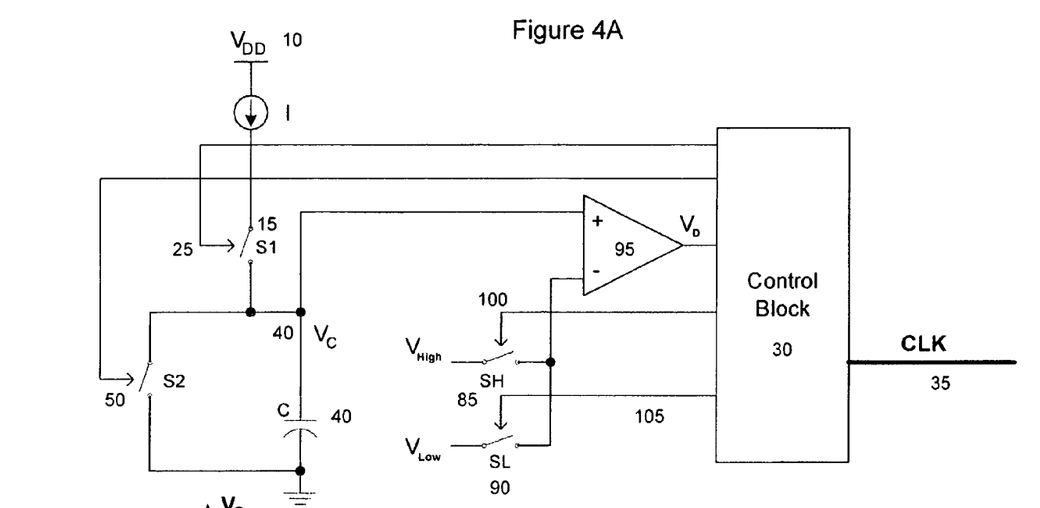
FIG. 4A shows an alternative embodiment using only one voltage detector.
Figure 4B:
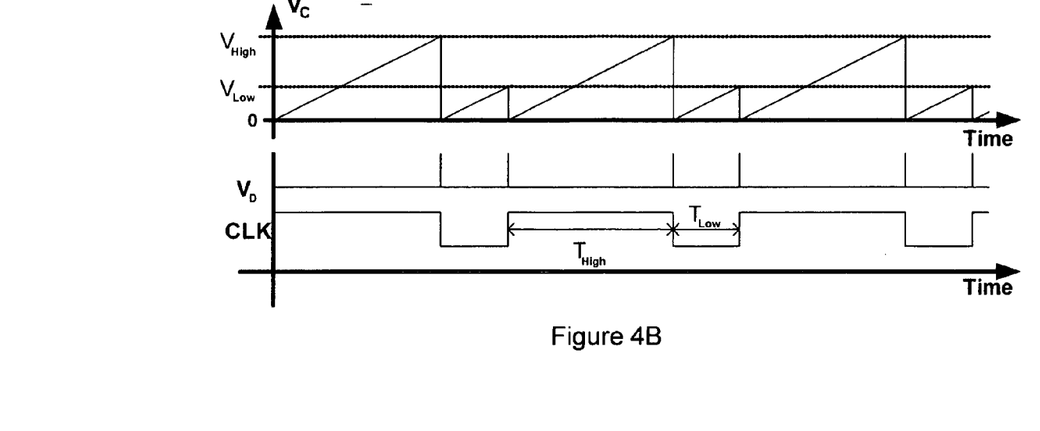
FIG. 4B is a timing diagram for the circuit of FIG. 4A.

Referring next to FIGS. 4A and 4B, where there is shown an alternative method for implementing the current invention, in this case with only one voltage detector instead of two. An embodiment of a circuit for implementing this approach is shown in FIG. 4A, and FIG. 4B shows the relevant signals. Elements which are common with FIG. 1 are assigned the same reference numerals. In this approach, switches SH and SL, designated at 85 and 90, respectively, are added to the design in order to switch either $V_{High}$ or $V_{Low}$ to the detector 95, depending on the state (high or low) of clock signal CLK, which generates control signals 100 and 105, supplied to control SH and SL, respectively. The output $V_b$ of detector 95 is supplied as the input to the control block 30.

Figure 5:
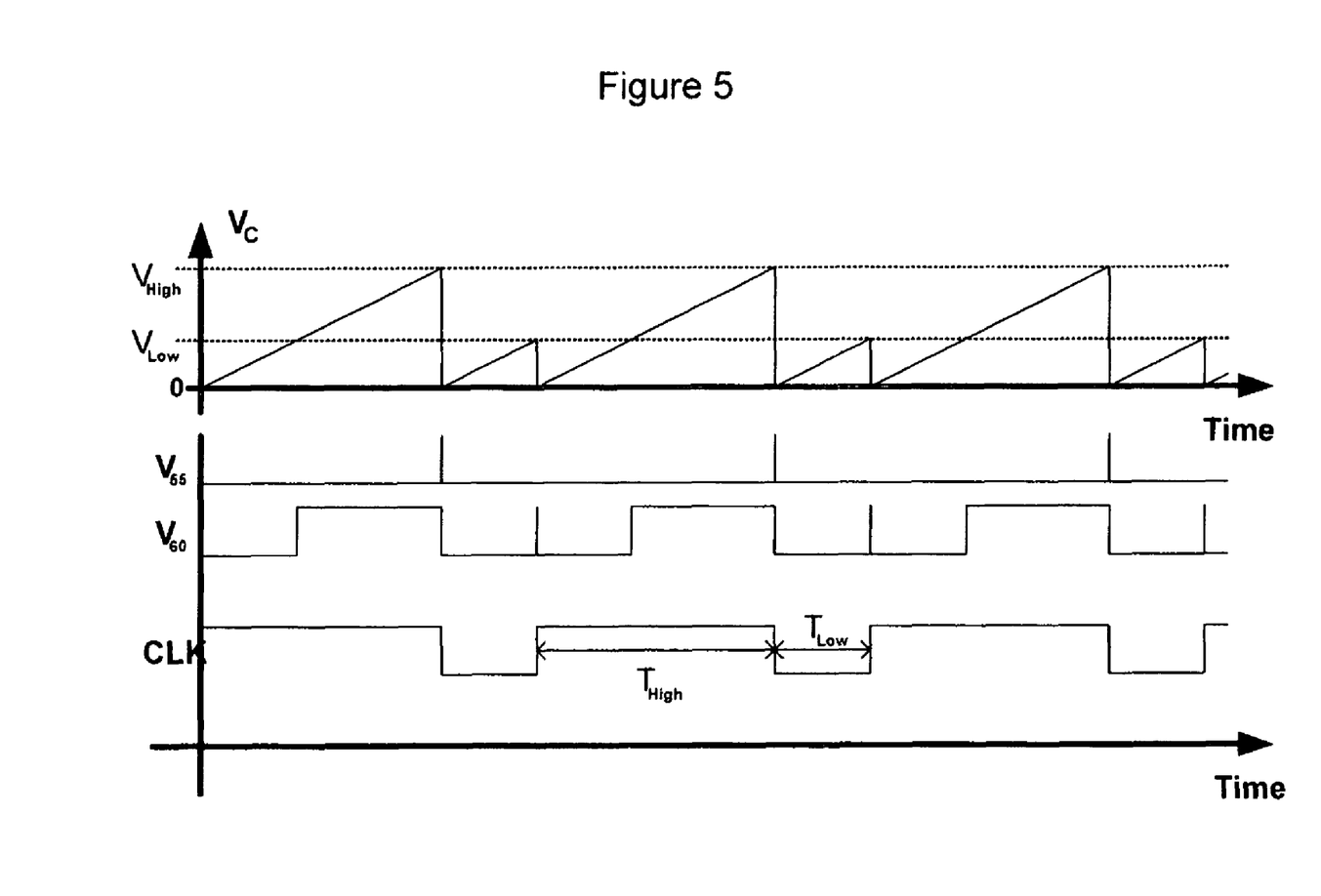
FIG. 5 is a timing diagram for the embodiment in FIG. 2 when both detectors are active at all times.

Referring next to FIG. 5, this Figure shows a timing diagram of signals for the embodiment shown in FIG. 2 when both detectors are active at all times. In this particular case the output of detector 60 is ignored during $T_{High}$.

Figure 6:
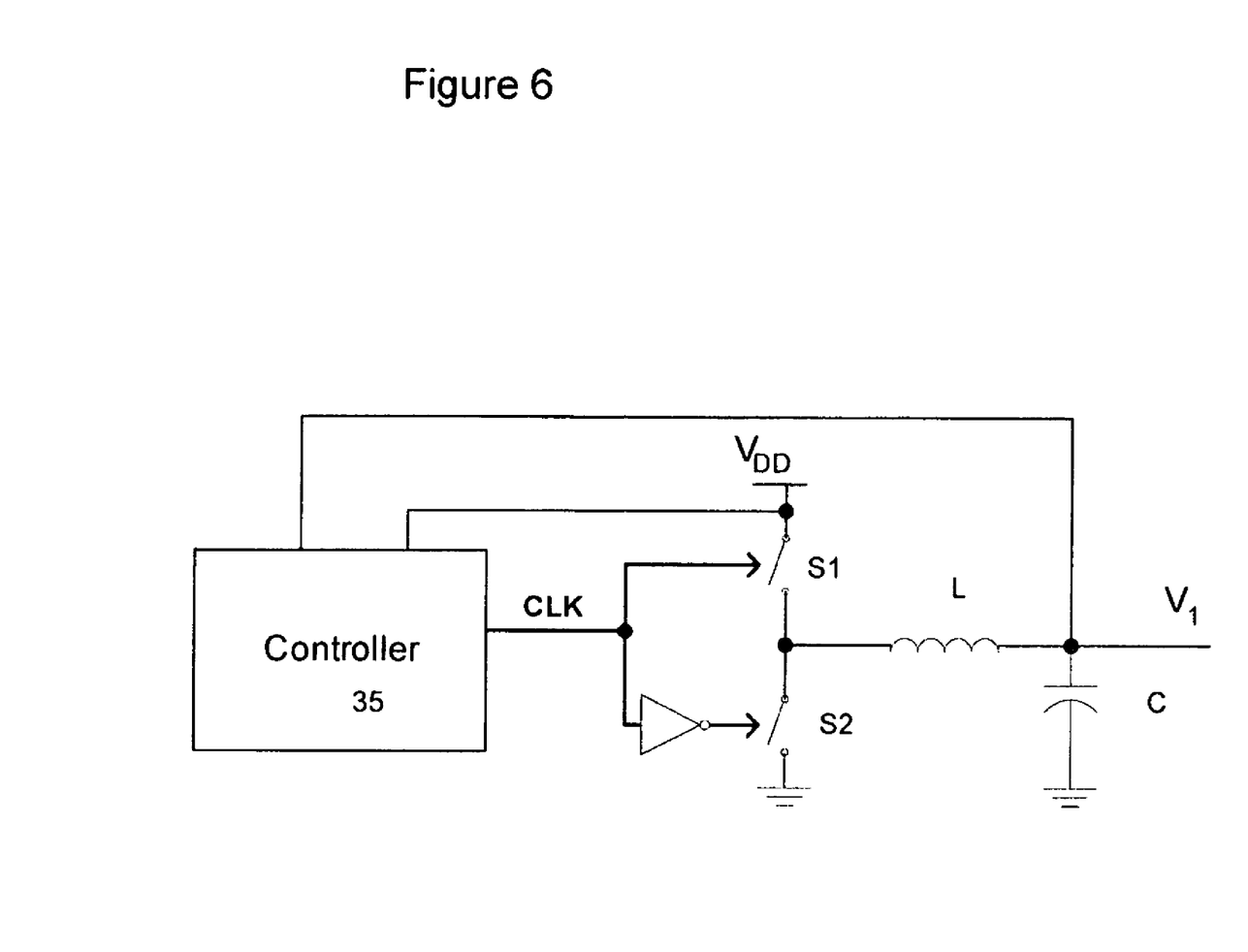
FIG. 6 shows a simplified block diagram of a common step-down switching power converter.

One application of the invention is as a clock in a switching power converter to adjust the duty cycle and frequency of the clock for different values of a power supply. FIG. 6 shows a simplified block diagram of a common step-down switching power converter where its output $V_1$ is less than input $V_{DD}$ ($V_1 < V_{DD}$). For this application, when CLK is at logic 1, switch S1 is conducting but switch S2 is open. And when CLK is at logic 0, S2 is conducting while S1 is open. Hence, the two switches S1 and S2 operate in sequence.

Current in the inductor L during on-time (when CLK is at 1) is $$I_L=T_{High}(V_{DD}-V_1)/L \quad (11)$$

Now, when the power converter is initially activated, its output voltage would be at zero ($V_1$=0). Hence, current $I_L$ is $$I_L=(T_{High}V_{DD})/L \quad (12)$$

and can reach a large value which can be sufficient to damage the inductor. Or, it can create a large voltage spike on the capacitor C and can damage either capacitor C or any other device that might be connected to $V_1$.

One solution at the initial start-up is to reduce value of $T_{High}$ for larger $V_{DD}$ values to reduce the current in the inductor L to improve the reliability of the converter. The reliability is an important issue primarily at the initial start-up phase when $V_1 \approx 0$.

In this application, the value of $V_{High}$ and consequently the value of $T_{High}$ (which is the time for which S1 in FIG. 6 is conducting) is set by design to be a function of the input voltage ($V_{DD}$) applied to the converter. Here, the value of $V_{High}$ is obtained from $$V_{High}=NV_{REF}-MV_{DD} \quad (13)$$

Figure 7:
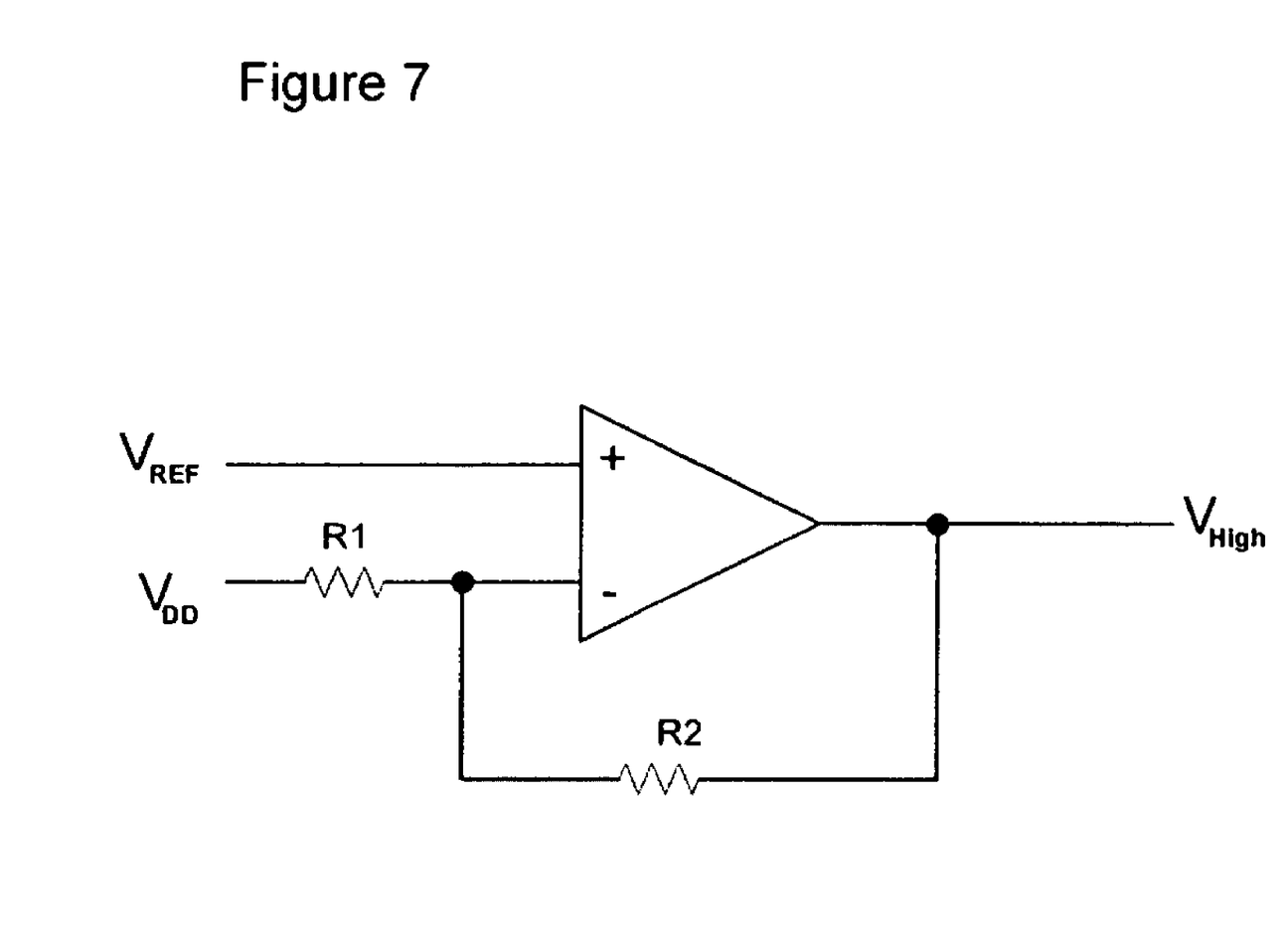
FIG. 7 depicts one methods for deriving $V_{High}$ from two voltages $V_{DD}$ and $V_{REF}$.

Both N and M are constant coefficients, and $V_{REF}$ is a reference voltage within the system. The goal is to create a relationship between $V_{High}$ and $V_{DD}$ such that $V_{High}$ (and $T_{High}$) is reduced as $V_{DD}$ is increased. FIG. 7 depicts one of the many possible methods of deriving $V_{High}$ from two voltages $V_{DD}$ and $V_{REF}$ that can be used in this invention. Using the circuit depicted in FIG. 7, the value of $V_{High}$ is calculated by $$V_{High}=V_{REF}(1+R2/R1)-V_{DD}(R2/R1) \quad (14)$$

Figure 8:
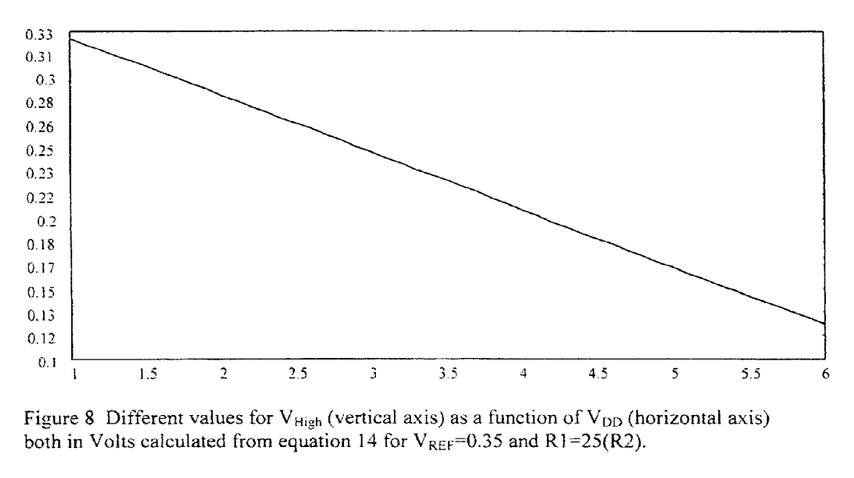
FIG. 8 shows a graph of $V_{High}$ as a function of $V_{DD}$.

FIG. 8 shows a graph for value of $V_{High}$ as a function of $V_{DD}$ where $V_{REF}$=350 mV and R1=25(R2). The relationship shown in equation 11 or 12 can be derived from any other analog or digital scheme inside or outside a chip. In at least some embodiments, as least one goal is to lower the value of $V_{High}$ (and consequently $T_{High}$ which is called "on-time") inside the converter as the power supply voltage is increased. In one embodiment, the clock of the present invention is integrated into a larger system, and the value of $V_{Low}$ is set by other circuits in the system to ensure proper regulation for the converter. In addition, values of capacitor C and current I (depicted in FIG. 2) are set so that the clock signal has a known frequency with a defined duty cycle. Having described the invention in detail, including several embodiments and alternatives, those skilled in the art will appreciate that numerous other alternatives and equivalents exist which are within the scope of the present invention. Therefore the invention is intended not to be limited by the above description, but rather only by the appended claims.

I claim:

1. A clock generator circuit comprising a first reference voltage for setting the portion of a clock period when the clock signal is high, a second reference voltage for setting the portion of a clock period when the clock signal is low, at least one voltage detector responsive to at least one of the first and second reference voltages, a control block for receiving signals from the at least one voltage detector derived at least in part from the first and second reference voltages, a selection circuit for selecting which of the reference voltages is applied to the control block wherein the selection circuit includes at least one component across which either voltage or current varies with time, and switch control signals generated by the control block for controlling the selection circuit.

2. The clock generator circuit of claim 1 wherein at least one of the time variant components is a capacitor.

3. The clock generator circuit of claim 2 wherein the value of the capacitor is variable.

4. The clock generator circuit of claim 1 wherein the at least one voltage detector comprises two voltage detectors.

5. A clock generator circuit comprising a timing circuit having an output that varies with time, a first reference signal, a second reference signal, a first voltage detector for comparing the first reference signal and the output of the timing circuit, a second voltage detector for comparing the second reference signal and the output of the timing circuit, and a control block, responsive to outputs from the first and second voltage detectors, for forming an output clock signal and generating at least one timing control signal for selectively applying charge to the timing circuit.

6. The clock generator circuit of claim 5 wherein at least one of the reference voltages is variable.

7. The clock generator circuit of claim 5 wherein the timing circuit has a time constant.

8. The clock generator circuit of claim 7 wherein varying the time constant varies at least one of the frequency or the duty cycle of the output clock signal.

9. The clock generator circuit of claim 5 wherein the at least one voltage detector is selected from a group comprising a voltage comparator, Schmitt trigger, an operational amplifier operating either open loop or with high gain through small feedback.

10. A clock generator circuit comprising at least one voltage detector, a selection circuit having an output which varies with time, wherein the selection circuit includes a current source, the output providing one input to the at least one voltage detector, a pair of reference voltages selectively applied as a second input to the at least one voltage detector, whereby the output out the voltage detector is determined by comparing the output of the selection circuit and the applied reference voltage, and a control block responsive to the voltage detector for generating a clock output having a variable frequency and duty cycle, and for generating switch control signals for operating the selection circuit.

11. A clock generator circuit comprising at least one voltage detector, a selection circuit having an output which varies with time, wherein the selection circuit has a time constant, the output providing one input to the at least one voltage detector, a pair of reference voltages selectively applied as a second input to the at least one voltage detector, whereby the output out the voltage detector is determined by comparing the output of the selection circuit and the applied reference voltage, and a control block responsive to the voltage detector for generating a clock output having a variable frequency and duty cycle, and for generating switch control signals for operating the selection circuit.

12. The clock generator circuit of claim 11 wherein the time constant is variable to adjust frequency and duty cycle of an output clock signal.

* * * * *